US006961012B2

(12) United States Patent
Hsueh

(10) Patent No.: US 6,961,012 B2
(45) Date of Patent: Nov. 1, 2005

(54) DATA-LINE DRIVER CIRCUIT FOR CURRENT-PROGRAMMED ELECTRO-LUMINESCENCE DISPLAY DEVICE

(75) Inventor: Wei-Chieh Hsueh, Tainan (TW)

(73) Assignee: Toppoly Optoelectronics Corp., (TW)

( * ) Notice: Subject to any disclaimer, the term of this patent is extended or adjusted under 35 U.S.C. 154(b) by 7 days.

(21) Appl. No.: 10/820,364

(22) Filed: Apr. 8, 2004

(65) Prior Publication Data

US 2004/0222748 A1 Nov. 11, 2004

(30) Foreign Application Priority Data

Apr. 10, 2003 (TW) .............................. 92108268 A

(51) Int. Cl.[7] ........................... H03M 1/00; G09G 3/36

(52) U.S. Cl. ...................... 341/135; 341/136; 341/144; 345/100; 345/98; 345/92

(58) Field of Search ................................ 341/135, 136, 341/144, 150, 155, 172; 345/100, 98, 99, 345/92, 90, 82

(56) References Cited

U.S. PATENT DOCUMENTS

2001/0033252 A1 * 10/2001 Yamazaki et al. ............. 345/7
2002/0190944 A1 * 12/2002 Morita ........................ 345/100
2003/0210219 A1 * 11/2003 Osame ........................ 345/92

* cited by examiner

*Primary Examiner*—Tuyet Thi Vo
(74) *Attorney, Agent, or Firm*—Dorsey & Whitney LLP

(57) ABSTRACT

The data-line driver circuit receives data currents from an external signal source and drives the pixel group of electro-luminescence display device. The data-line driver circuit has a first circuit group, a second circuit group and a shift register. The shift register controls the first circuit group to receive the data currents and controls the second circuit group to duplicate the data currents and then send them to the pixel group.

9 Claims, 6 Drawing Sheets

DATA-LINE DRIVER CIRCUIT FOR CURRENT-PROGRAMMED ELECTRO-LUMINESCENCE DISPLAY DEVICE

BACKGROUND OF THE INVENTION

1. Field of Invention

The present invention relates to a data-line driver circuit. More particularly, the present invention relates to a data-line circuit for a current-programmed electro-luminescence display device, 2. Description of Related Art Electro-luminescence (EL) device is activated through a current drove method either in passive matrix scheme or active matrix scheme. Especially in the active scheme, the charge is held on a capacitor and applied to the pixels of EL device through a transistor driver circuit. A simplest and essential driver circuit of an active-matrix electro-luminescence display device is illustrated in FIG. 1. In FIG. 1, transistor 102 is called a switching thin film transistor (switching TFT) and transistor 104 modulates the current for driving a light-emission element 108 in response to a signal voltage of a storage capacitor 106, so the transistor 104 is called a driving TFT. The signal voltage stored in the storage capacitor 106 is refreshed per frame time.

Nonetheless, the method of utilizing voltages to drive directly the driving TFT 104 as in the foregoing description would generate different light intensities by the same driving voltage due to every driving TFT having different characters. Therefore, a method of utilizing currents to drive the driving TFT 104 is generally used to adjust the threshold voltage and the mobility of the driving TFT 104.

However, there is a disadvantage of an electro-luminescence display device driven by currents. Data currents are generally provided by data lines, so the quantity of current sources must be equal to the quantity of data lines. In other words, many data lines and current sources are required to satisfy the demands for large size and high resolution in modern electro-luminescence display devices. Sony Corp. therefore has provided a current latch circuit to decrease the quantity of current sources, as illustrated in FIG. 2.

In FIG. 2, the current latch circuit includes a circuit 202, a circuit 204, a circuit 206, a circuit 212, a circuit 214, a circuit 216, a shift register (SR) 208, a shift register 218, an enabling means 209, an enabling means 219 and a pixel group 220. The circuit 202 and circuit 212 are in charge of red pixels of the pixel group 220, the circuit 204 and circuit 214 are in charge of green pixels of the pixel group 220, and the circuit 206 and circuit 216 are in charge of blue pixels of the pixel group 220. The pixel group 220 includes a plurality of pixels; a scanning line switches these pixels for writing data currents. The shift register 208 and the enabling means 209 control a first circuit group 201; the first circuit group 201 includes the circuit 202, the circuit 204, and the circuit 206. The shift register 218 and the enabling means 219 control a second circuit group 211; the first circuit group 211 includes the circuit 212, the circuit 214, and the circuit 216.

The input data procedures of the current latch circuit in FIG. 2 is described as follows. The shift register 208 sequentially writes a data current $I_{data}$ into the circuits of the first circuit group 201, when the data current $I_{data}$ is sent to the current latch circuit. After finishing the foregoing writing procedure of the first circuit group, the shift register 218 is switched to write sequentially the subsequent data current $I_{data}$ into the circuits of the second circuit group 211. Meanwhile, the enabling means 209 instructs the first circuit group 201 to send the data current $I_{data}$ stored therein to corresponding pixels of the pixel group 220. Similarly, after finishing the writing procedure of the second circuit group 211, the shift register 208 is switched again to write the data current $I_{data}$ into the first circuit group 201, and, at the same time, the enabling means 219 instructs the second circuit group 211 to send the data current $I_{data}$ stored therein to corresponding pixels of the pixel group 220, The first circuit group 201 and the second circuit group 211 take turns receiving and then sending the data current. While data current is being written into one, the other is in charge of sending another data current to the pixel group. And after both of them have finished these procedures, they interchange their functions, thus repeatedly receiving and sending out the data currents.

This current latch circuit can substantially decrease the quantity of current sources, but each circuit groups and each shift register thereof must be controlled by external control signal (not shown) because this current latch circuit is based on two circuit groups interchanging. Disadvantages of the conventional system include too many external control signal lines and poor quality of the display device because two individual circuit groups interfere somewhat with the data currents.

SUMMARY OF THE INVENTION

The present invention provides a data-line driver circuit for a current-programmed electro-luminescence display device that satisfies the need to decrease the quantity of external control signal lines and the quantity of electronic elements in a current latch circuit.

The invention changes the two circuit groups of the current latch circuit from receiving and sending data currents in parallel connection to receiving and sending data currents in series connection. The data-line driver circuit receives data currents from an external signal source and drives the pixel group of an electro-luminescence display device. The data-line driver circuit includes a first circuit group, a second circuit group and a shift register. The shift register controls the first circuit group to receive the data currents and controls the second circuit group to duplicate the data currents and then send them to the pixel group.

In one preferred embodiment of the present inventions, the first circuit group is always in charge of receiving the data current $I_{data}$ from the external signal source and writing the data current $I_{data}$ to the second circuit group, and the second circuit group is always in charge of receiving the data current $I_{data}$ from the first circuit group and writing the data current $I_{data}$ to the pixel group. Under this circuit configuration, every circuit does not itself need to receive and write the data current to pixel group 330.

In conclusion, the invention changes the connection configuration and operating method of the conventional current latch circuit to decrease the quantities of external control signal lines and electronic elements. This means the space occupied thereby is also lessened. For display devices with limited space, such as notebooks whose size is fixed at A4 size, if its frame can be made smaller, the visible area of the display device is comparatively larger.

Furthermore, the invention avoids the problem of an unstable gray scale. The invention uses the same circuit to send signal current to the pixel group, and the characters of electronic elements in the circuit are thus stable. Variations in currents sent out therefrom are avoided because of different characteristics of different circuits even if the original signals are identical.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

The present invention provides a data-line driver circuit for a current-programmed electro-luminescence display device to improve the problems of too many external control signal lines and unstable gray scale of the conventional current latch circuit.

Figure 3:
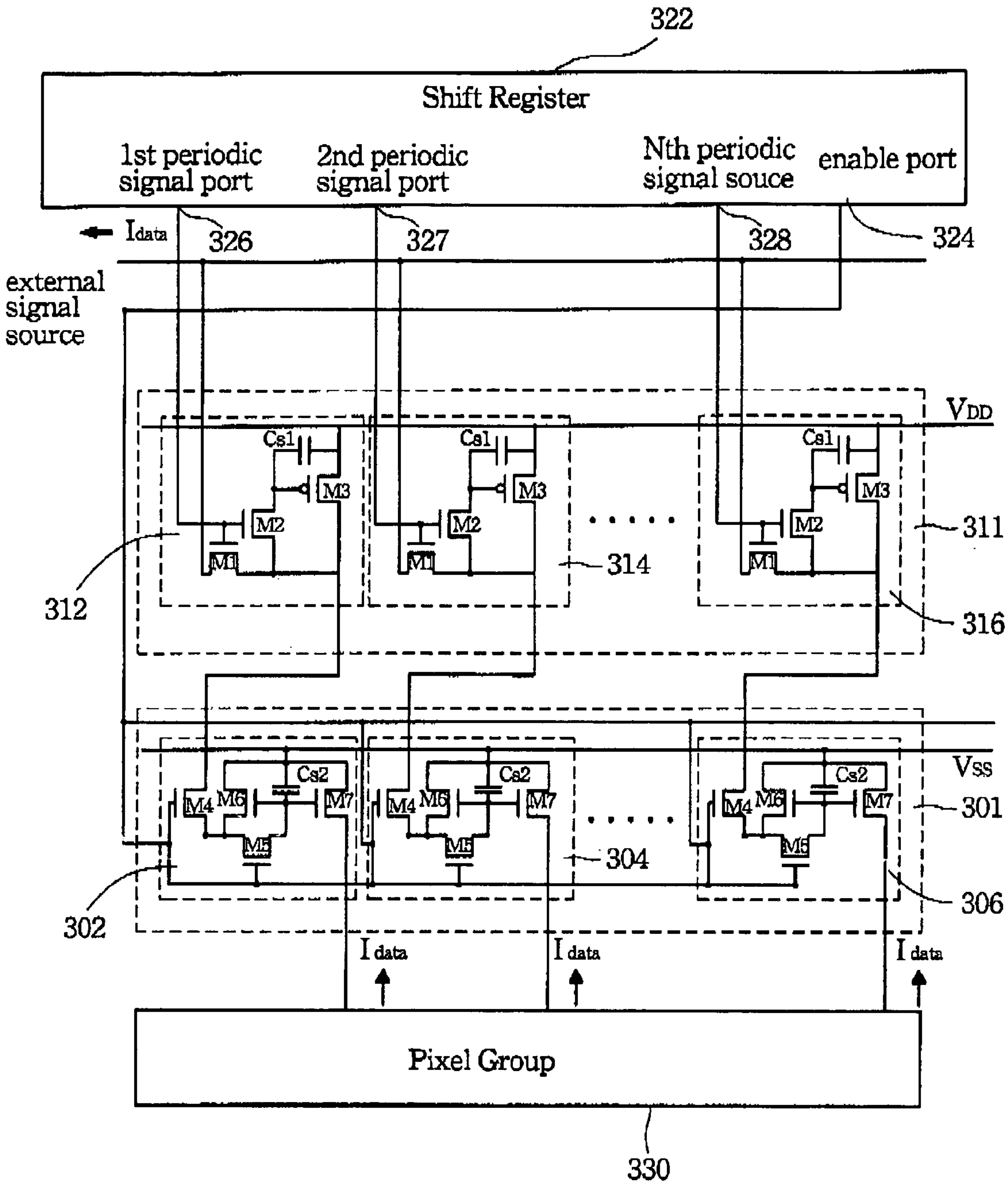
FIG. 3 is a circuit diagram in accordance with one embodiment of the invention.

FIG. 3 illustrates one preferred embodiment of the invention. Circuits 302 and 312 form one unit of current latch circuits. The current latch circuit is a current sink-type, and comprises seven thin film transistors M1–M7, two capacitors Cs1 and Cs2. The capacitors Cs1 and Cs2 are used to store the data current $I_{data}$, and the shift register 322 further has an enable function. The following description will further explain the enable function. The invention changes the two circuit groups of the current latch circuit from receiving and sending data currents in parallel connection to receiving and sending data currents in series connection.

The shift register 322 controls the operation of a circuit group 301 and a circuit group 311, and has several periodic signal ports, from a first periodic signal port 326 to a second periodic signal port 327, and on to a Nth periodic signal port 328. The circuit 312 is coupled with the first periodic signal port 326, a circuit 314 is coupled with the second periodic signal port 327, and a circuit 316 is coupled with the Nth periodic signal port 328. The circuits 302, 304, and 306 all are coupled with an enable port 324 of the shift register 322. The circuits 302, 304, 306 form the circuit group 301, and the circuits 312, 314, 316 form the circuit group 311.

Figure 4:
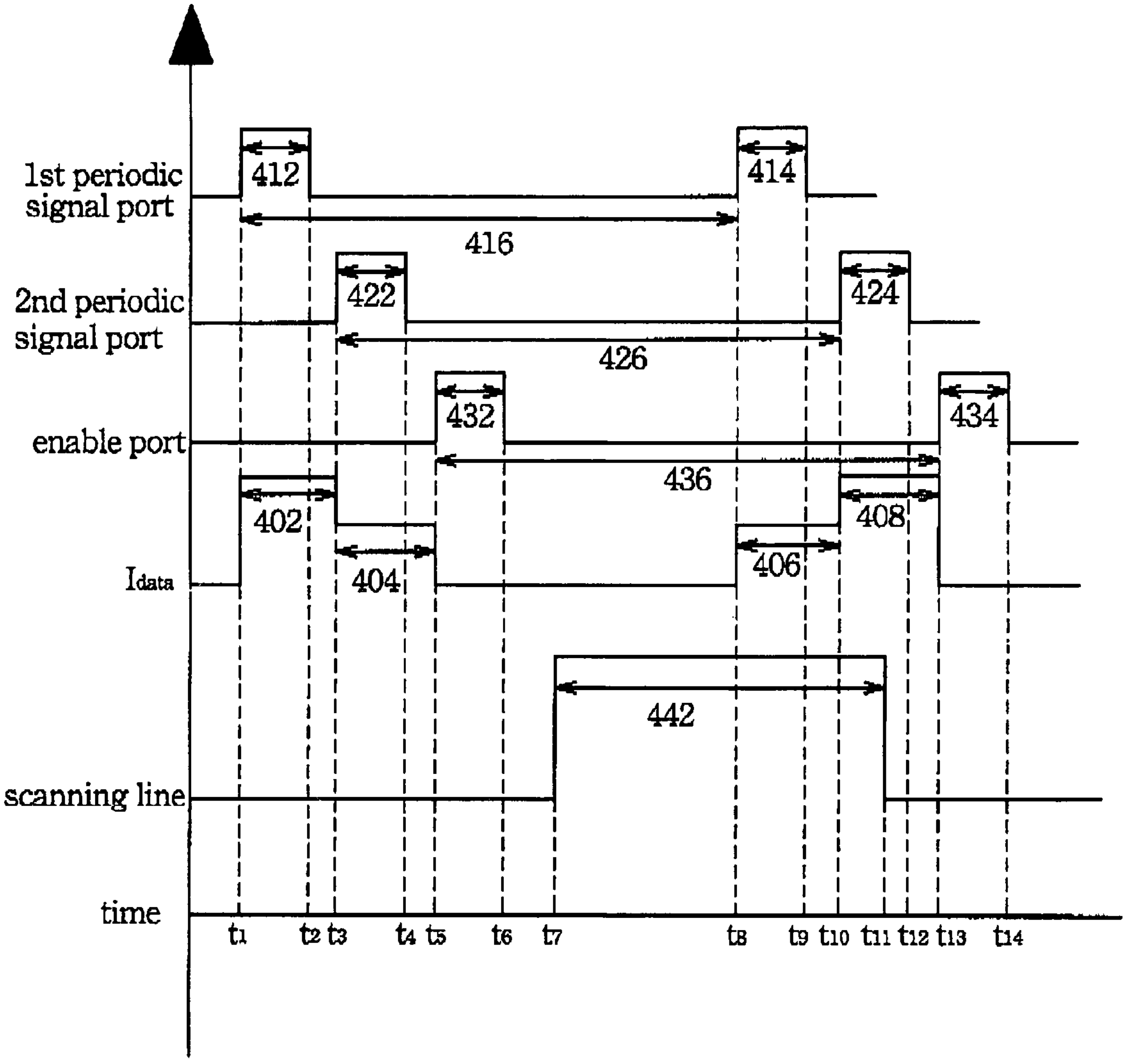
FIG. 4 is a timing chart of the embodiment in FIG. 3.

FIG. 4 is a timing chart of the embodiment in FIG. 3, only recites two units of current latch circuits, and each unit current latch circuit is in series connection, i.e. the circuits 302/312, and the circuits 304/314 in FIG. 3, it is more easily and clearly to understand a mechanism of the current latch circuits in series connection by referring FIG. 3 and FIG. 4 simultaneously.

In FIG. 4, the first periodic signal port 326 has two turn-on durations, i.e. a duration 412 from time $T_1$ to time $T_2$, and a duration 414 from time $T_8$ to time $T_9$. A periodic Interval 416 (from time $T_1$ to time $T_8$) exists between the duration 412 and the duration 414. The second periodic signal port 327 has two turn-on durations, i.e. a duration 422 from time $T_3$ to time $T_4$, and a duration 424 from time $T_{10}$ to time $T_{12}$. A periodic interval 426 (from time $T_3$ to time $T_{10}$) exists between the duration 422 and the duration 424. The enable port 324 also has two turn-on durations, i.e. a duration 432 from time $T_5$ to time $T_6$, and a duration 434 from time $T_{13}$ to time $T_{14}$. A periodic interval 436 (from time $T_5$ to time $T_{13}$) exists between the duration 432 and the duration 434.

The shift register 322 operates the first periodic signal port 326, the second periodic signal port 327, and the enable port 324 with a same period; the three intervals 416, 426, and 436 are therefore identical. Moreover, there are time shifts between each of the other durations 412, 422, and 432, to avoid operating problems of data currents in the first periodic signal port 326, the second periodic signal port 327 and the enable port 324 due to their turn-on time point being too close. Subsequent durations 414, 424, and 434 are the same as well.

A data current $I_{data}$ of FIG. 4 is provided a data current which inputs signals into the current latch circuit, and includes a data 402 from time $T_1$ to time $T_3$, a data 404 from time $T_3$ to time $T_5$, a data 406 from time $T_8$ to time $T_{10}$, and a data 408 from time $T_{10}$ to time $T1_3$. The magnitudes of the data 402, 404, 406, and 408 are presented as four different data signals and do not contain any other special meaning. A scanning line (not illustrated in FIG. 3) corresponding to pixels of the pixel group 330 is turned on from time $T_7$ to time $T_{11}$. The following description interprets the operating procedure of the current latch circuit as illustrated in FIG. 3 and FIG. 4.

When the data current $I_{data}$ is input into the current latch circuit from an external signal source, the shift register 322 turns on the duration 412 of the first periodic signal port 326, and the capacitor Cs1 of the circuit 312 starts to store the data 402 of the data current $I_{data}$. Then the shift register 322 turns on the duration 422 of the second periodic signal port 327, and the capacitor Cs1 of the circuit 314 starts to store the data 404 of the data current $I_{data}$.

After that, the shift register 322 turns on the duration 432 of the enable port 324, and a voltage stored in the Cs1 of the circuit 312 is converted to a data current $I_{data}$ by a transistor M3 of the circuit 312. Then the data current $I_{data}$ is converted to a voltage and stored in the Cs2 of the circuit 302 by a transistor M6 of the circuit 302. The circuits 304\314 and circuits 306\316 are also operated according to the foregoing method. Later, the scanning line (not illustrated in FIG. 3) corresponding to pixels of the pixel group 330 turns on the duration 442, and the circuit 302 and the circuit 304 therefore separately writes the data current $I_{data}$ stored respectively into pixels of the pixel group 330 corresponding thereto.

During the duration 442, the shift register 322 turns on the duration 414 of the first periodic signal port 326, and the data 406 of the data current $I_{data}$ is therefore stored in the capacitor Cs1 of the circuit 312. Then the shift register 322 turns on the duration 424 of the second periodic signal port 327, and the data 408 of the data current $I_{data}$ is therefore stored in the capacitor Cs1 of the circuit 314. Finally, the shift register 322 turns on the duration 434 of the enable port 324; at this time, the voltages stored in the capacitors Cs1 of the circuits 312 and 314 are respectively duplicated to the capacitor Cs2 of the circuits 302 and 304.

Before the duration 434, a scanning line of the previous pixels in pixel group 330 must be closed; i.e. the duration 442 is ended at time $T_{11}$, before the beginning time $T_{13}$ of the duration 434. Otherwise, the data of the data current $I_{data}$ stored in the circuits 312 and 314 are directly written into the pixel group 330 during the duration 434, and are not stored in the capacitor Cs2 of the circuits 312 and 314 separately.

Consequently, the circuit group 311 is always in charge of receiving the data current $I_{data}$ from the external signal source and writing the data current $I_{data}$ to the circuit group 301, and the circuit group 301 is always in charge of receiving the data current $I_{data}$ from the circuit group 311 and writing the data current $I_{data}$ to the pixel group 330. Under the circuit configuration in FIG. 3, every circuit does not itself need to receive and write the data current to pixel group 330. The preferred embodiment of the invention illustrated in FIG. 3 is of the current sink-type; the input of the data current $I_{data}$ is thus actually drains the data current $I_{data}$ from the pixel group 330. Therefore, the transmitting direction of the data current $I_{data}$ in the current sink-type circuit is opposite to the transmitting direction of the data current $I_{data}$ in a current source-type circuit.

There is an additional advantage of this current latch circuit in series connection. In the current latch circuit in parallel connection provided by Sony Corp., an enabling means responsible for enabling while a circuit group writes the pixel group must maintain a turned-on state. But the current latch circuit in series connection of the invention only needs a turn-on periodic signal. In other words, the enable function can be achieved by the shift register, and the shift register periodically switches the enable operations.

Figure 5:
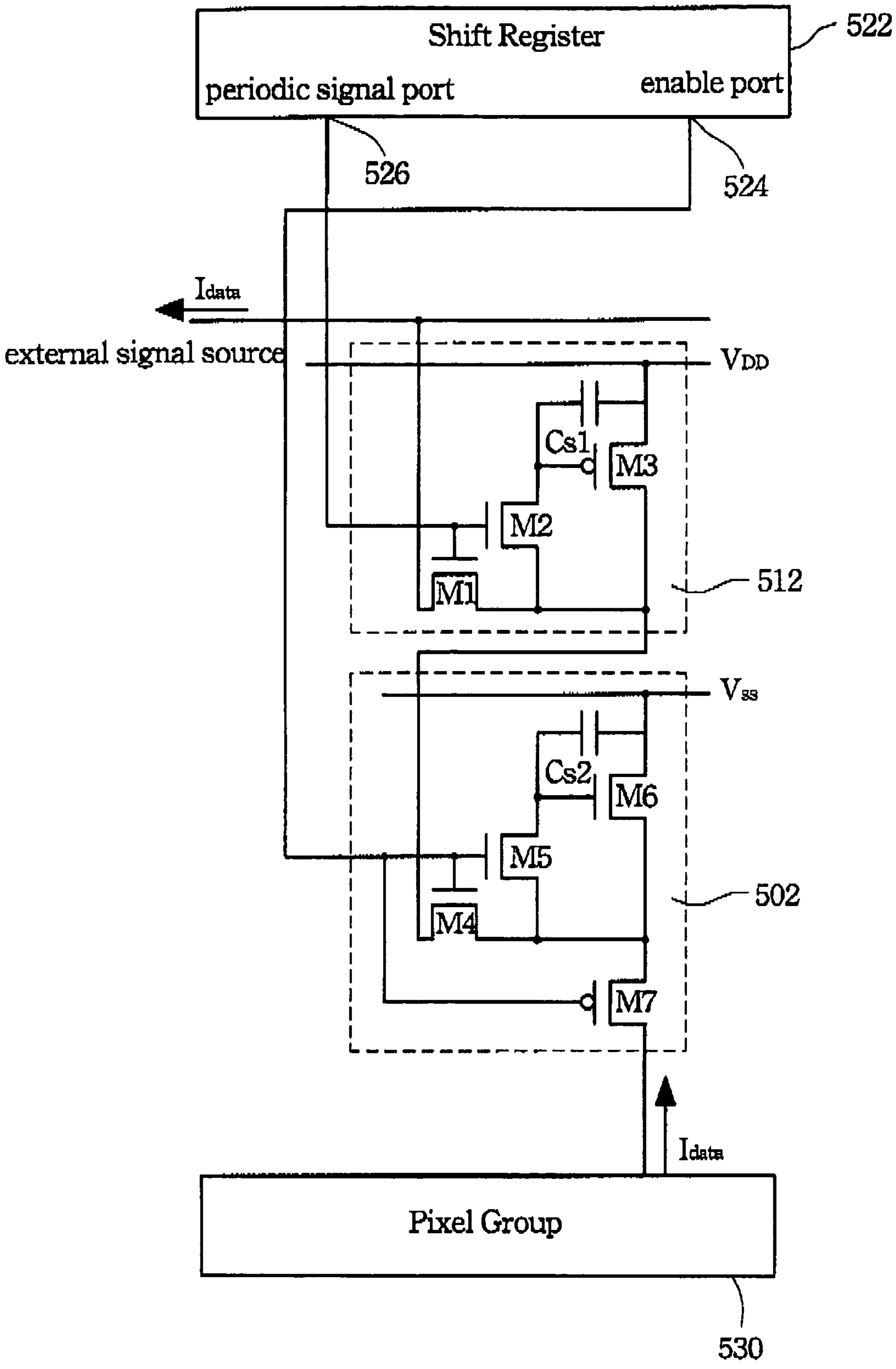
FIG. 5 is a circuit diagram in accordance with another embodiment of the invention.

FIG. 5 illustrates another preferred embodiment of the invention. Circuits 502 and 512 are formed one unit of current latch circuit. The format of the current latch circuit is also a current sink-type, and comprises seven thin film transistors M1–M7, two capacitors Cs1 and Cs2. The capacitors Cs1 and Cs2 are used to store the data current $I_{data}$ and the shift register 522 has a function of enabling. The circuit 512 is coupled with the periodic signal port 526 of the shift register 522, and the circuit 502 is coupled with an enable port 524 of the shift register 522.

This preferred embodiment is also of the current sink-type, only reciting one unit of current latch circuit for interpreting. The shift register 522 only has one periodic signal port 526. But if there is more than one unit of current latch circuit, the shift register 522 can be expanded to take charge of more than one unit of current latch circuit.

When the data current $I_{data}$ is input into the current latch circuit from an external signal source, the shift register 522 turns on the periodic signal port 526, and the capacitor Cs1 of the circuit 512 starts to store the data current $I_{data}$ After that, the shift register 522 turns on the enable port 524, and a voltage stored in the Cs1 of the circuit 512 is transferred to the data current $I_{data}$ by a transistor M3 of the circuit 512. Then the data current $I_{data}$ is transferred to a voltage and stored in the Cs2 of the circuit 502 by a transistor M6 of the circuit 502. Later, the scanning line (not illustrated in FIG. 5) corresponding to pixels of the pixel group 530 is turned on, and the circuit 502 therefore writes the data current $I_{data}$ into pixels of the pixel group 530. While writing data current $I_{data}$, the periodic signal port 526 is turned on again to store the data current $I_{data}$ in the Cs1 of the circuit 512 again, and then the foregoing operating is repeated.

Figure 6:
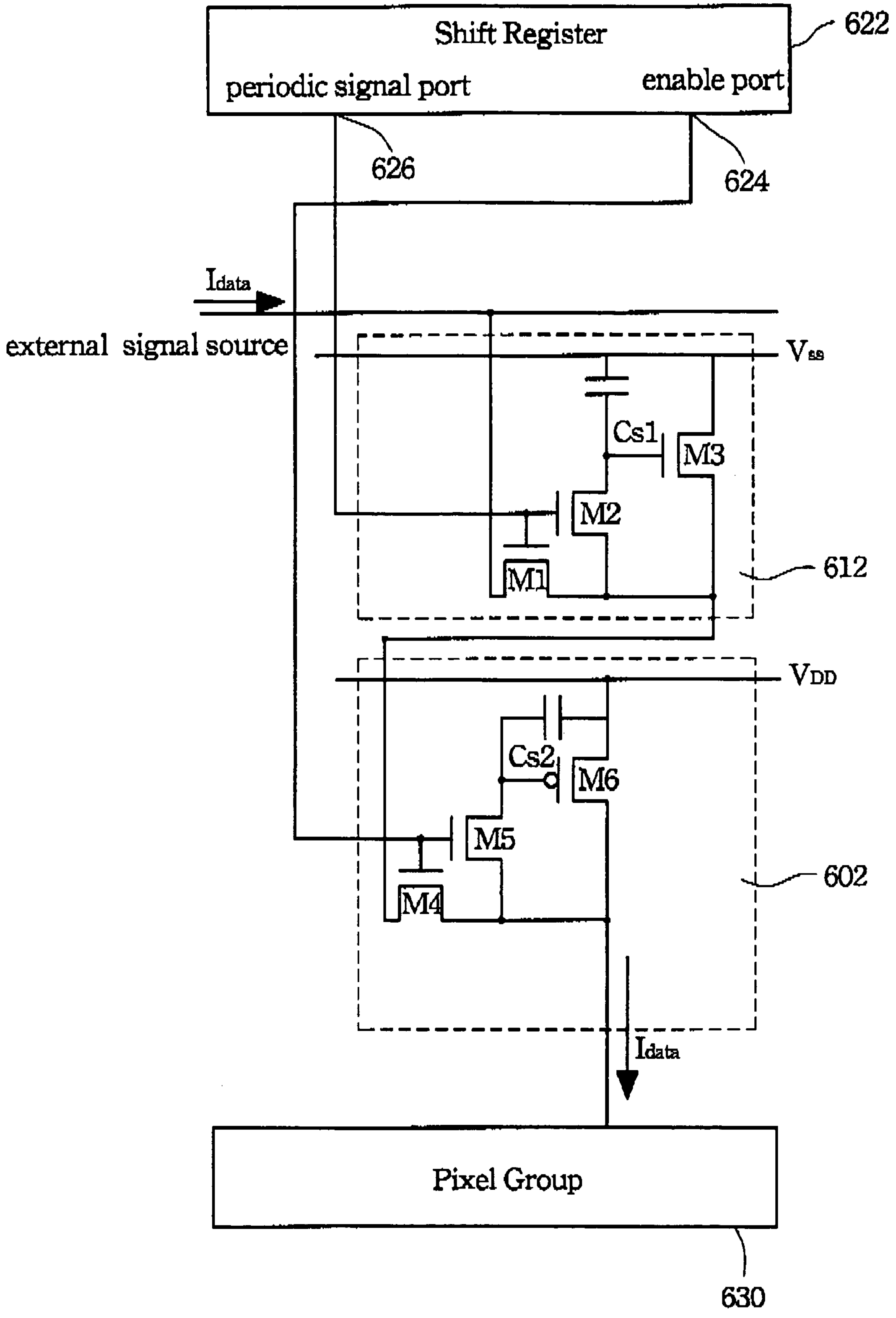
FIG. 6 is a circuit diagram in accordance with another embodiment of the invention.

FIG. 6 illustrates another preferred embodiment of the invention. Circuits 602 and 612 are formed one unit of current latch circuit. The current latch circuit is a current source-type, and comprises seven thin film transistors M1–M7, two capacitors Cs1 and Cs2. The capacitors Cs1 and Cs2 are used to store the data current $I_{data}$, and the shift register 622 has an enabling function. The circuit 612 is coupled with the periodic signal port 626 of the shift register 622, and the circuit 602 is coupled with an enable port 624 of the shift register 622.

This preferred embodiment is of the current source-type, only reciting one unit of current latch circuit for interpreting. The shift register 622 therefore only has one periodic signal port 626. But if there is more than one unit of current latch circuit, the shift register 622 can be expanded to take charge of more than one unit of current latch circuit.

When the data current $I_{data}$ is input into the current latch circuit from an external signal source, the shift register 622 turns on the periodic signal port 626, and the capacitor Cs1 of the circuit 612 starts to store the data current $I_{data}$. After that, the shift register 622 turns on the enable port 624, and a voltage stored in the Cs1 of the circuit 612 is transferred to the data current $I_{data}$ by a transistor M3 of the circuit 612. Then the data current $I_{data}$ is transferred to a voltage and stored in the Cs2 of the circuit 602 by a transistor M6 of the circuit 602. Later, the scanning line (not illustrated in FIG. 6) corresponding to pixels of the pixel group 630 is turned on, and the circuit 602 therefore writes the data current $I_{data}$ into pixels of the pixel group 630. While writing data current $I_{data}$, the periodic signal port 626 is turned on again to store the data current $I_{data}$ in the Cs1 of the circuit 612 again, and then the foregoing operation is repeated.

These three embodiments explain that the invention can use not only the current sink-type current latch circuit but also the current source-type current latch circuit. The features of the invention are as follows: the circuits coupled with the periodic signal port of the shift register are also coupled with the external signal source; the circuits coupled with the enable port of the shift register are also coupled with the pixel group; and these foregoing two circuits are coupled with each other in series connection.

Moreover, from the first embodiment and the second embodiment, it is evident that the configuration of electronic elements in the circuits is not limited by these embodiments recited foregoing.

Figure 1:
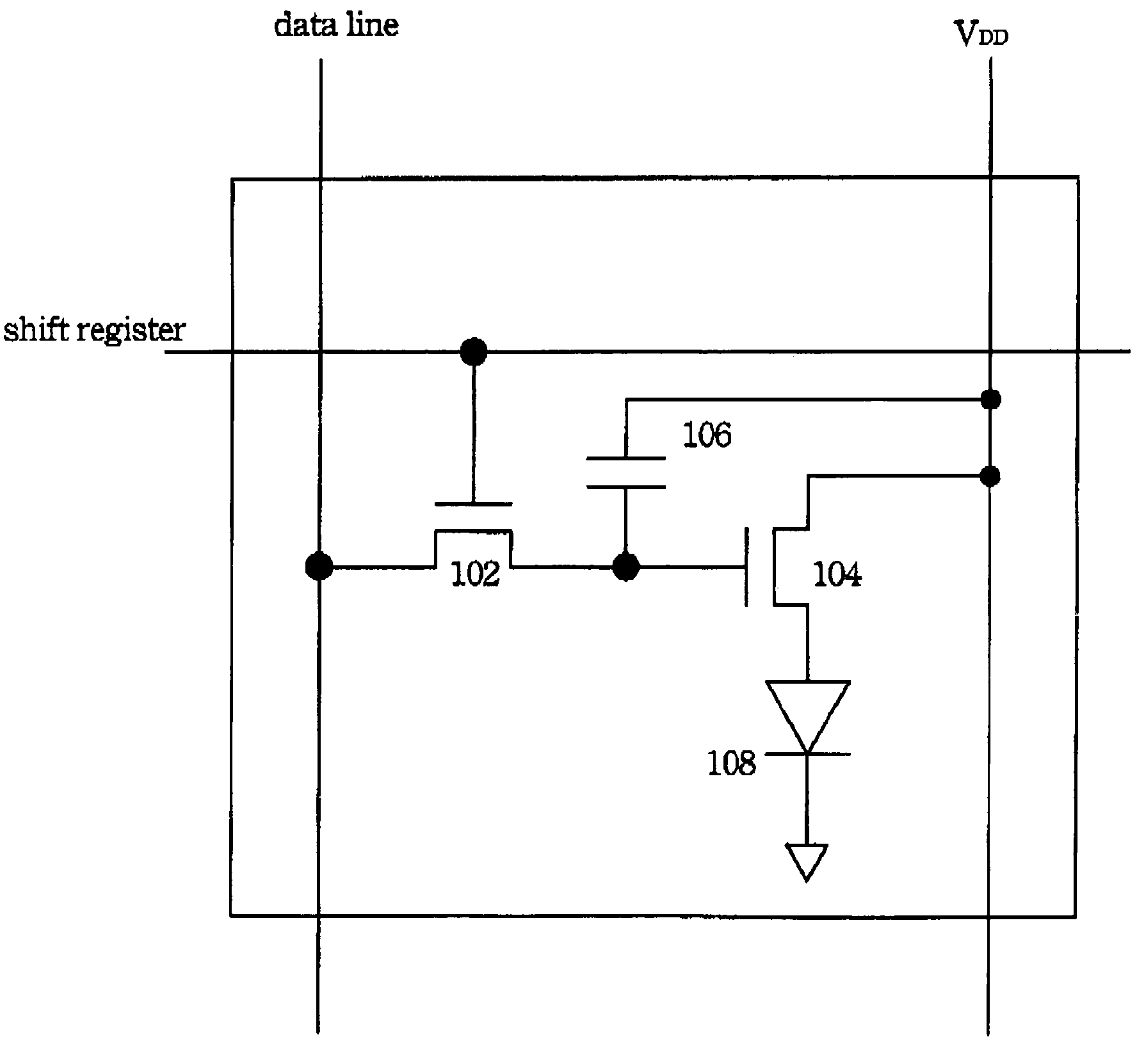
Fig. 1 (PRIOR ART)
FIG. 1 is a simplest and essential circuit diagram of a conventional active-matrix driver circuit.
Figure 2:
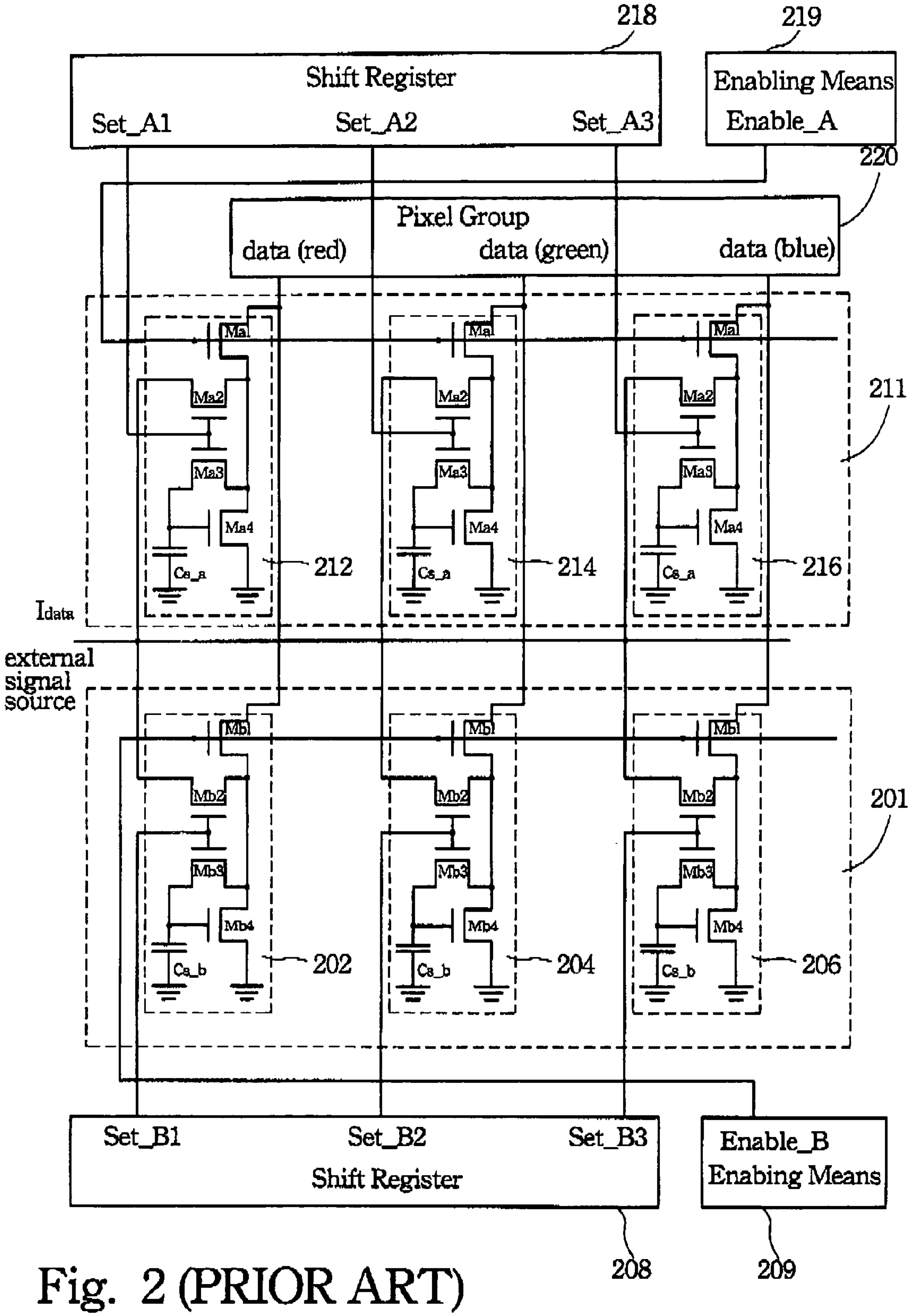
Fig. 2 (PRIOR ART)
FIG. 2 is a circuit diagram of a conventional current latch circuit.

Comparing the current latch circuit in series connection of the invention with the current latch circuit in parallel connection of Sony Corp, the invention has following advantages:

1. The quantity of shift registers is decreased. In FIG. 2, the current latch circuit of Sony Corp. needs two shift registers 208 and 218, but in FIG. 3, the current latch circuit of the invention only needs one shift register 322.

2. An additional switching to switch the current latch is unnecessary. In FIG. 2, there are two enabling means 209 and 219 in the current latch circuit of Sony Corp., but in FIG. 3, there is only one enable port 324, and the enable port 324 is provided by the shift register 322.

3. Two additional external control signal lines to control the current latch are unnecessary. In FIG. 2, the Enable_A and Enable_B need to be provided additionally, and are not directly provided by shift register 322 in FIG. 3.

4. The quantity of transistors is decreased. Every unit of current latch circuit in FIG. 2 includes eight transistors, but every unit of current latch circuit in FIG. 3 only includes seven transistors.

In conclusion, the invention changes the connection configuration and operating method of the conventional current latch circuit to decrease the quantities of external control signal lines and electronic elements. The electro-luminescence display device with this current latch circuit of the invention includes fewer external control signal lines and electronic elements, consequently reducing space occupied thereby. Generally, the external control signal lines and ICs are positioned inside the frame of the electro-luminescence display device.

If the quantity of the lines is great, the frame of the electro-luminescence display device is larger to contain these lines therein. For display devices with limited size, like notebooks whose size is fixed at A4, if its frame can make smaller, the visible area of the display device is comparatively larger. This improvement makes the display devices thinner, lighter and better than cathode ray tube display devices.

Furthermore, the invention avoids the problem of unstable gray scale. The invention uses the same circuit to send signal current to the pixel group, and the characters of electronic elements in the circuit are stable, thus avoiding variations in currents sent out therefrom due to different characteristics of different circuits even when the original signals are identical.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data-line driver circuit for a current-programmed electro-luminescence display device, receiving at least one data current from an external signal source, and driving a pixel group of the electro-luminescence display device, the data-line driver circuit comprising:

- a shift register having a periodic signal port and an enable port;
- a first circuit group comprising at least one first circuit for storing current, the first circuit controlled by the periodic signal port to receive the data current; and
- a second circuit group comprising at least one second circuit for storing current, wherein the second circuit and the first circuit are connected in series, and the enable port controls the second circuit to duplicate and send the data current to the pixel group.

2. The data-line driver circuit of claim 1, wherein the first circuit group comprises a plurality of the first circuits and the second circuit group comprises a plurality of the second circuits, the first circuits are sequentially and respectively controlled by a plurality of the periodic signal ports to sequentially and respectively receive a plurality of the data currents, and the second circuits are sequentially controlled by the enable port to sequentially and respectively duplicate the data currents from the first circuits and then sequentially and respectively send the data currents to the pixel group.

3. The data-line driver circuit of claim 1, wherein the data-line driver circuit is current source-type or current sink-type.

4. The data-line driver circuit of claim 3, wherein when the data-line driver circuit is current source-type, a current output port of the first circuit is coupled with a current input port of the second circuit, a current input port of the first circuit is coupled with the external signal source, and a current output port of the second circuit is coupled with the pixel group.

5. The data-line driver circuit of claim 3, wherein when the data-line driver circuit is current sink-type, a current input port of the first circuit is coupled with a current output port of the second circuit, a current output port of the first circuit is coupled with the external signal source, and a current input port of the second circuit is coupled with the pixel group.

6. A data-line driver circuit for a current-programmed electro-luminescence display device, receiving at least one data current from an external signal source, and driving a pixel group of the electro-luminescence display device, wherein the data-line driver circuit is current source-type, the data-line driver circuit comprising:

- a shift register having a periodic signal port and an enable port;
- a first circuit group comprising at least one first circuit for storing current, the first circuit controlled by the periodic signal port to receive the data current from the external signal source; and
- a second circuit group comprising at least one second circuit for storing current, wherein a current input port of the second circuit is coupled with a current output port of the first circuit, and the enable port controls the second circuit to duplicate the data current from the first circuit and send the data current to the pixel group.

7. The data-line driver circuit of claim 6, wherein the first circuit group comprises a plurality of the first circuits and the second circuit group comprises a plurality of the second circuits, the first circuits are sequentially and respectively controlled by a plurality of the periodic signal ports to sequentially and respectively receive a plurality of the data currents, and the second circuits are sequentially controlled by the enable port to sequentially and respectively duplicate the data currents from the first circuits and then sequentially and respectively send the data currents to the pixel group.

8. A data-line driver circuit for a current-programmed electro-luminescence display device, receiving at least one data current from an external signal source, and driving a pixel group of the electro-luminescence display device, wherein the data-line driver circuit is current sink-type, the data-line driver circuit comprising:

- a shift register having a periodic signal port and an enable port;
- a first circuit group comprising at least one first circuit for storing current, the first circuit controlled by the periodic signal port to receive the data current from the external signal source; and
- a second circuit group comprising at least one second circuit for storing current, wherein a current input port of the second circuit is coupled with a current output port of the first circuit, and the enable port controls the second circuit to duplicate the data current from the first circuit and send the data current to the pixel group.

9. The data-line driver circuit of claim 8, wherein the first circuit group comprises a plurality of the first circuits and the second circuit group comprising a plurality of the second circuits, the first circuits are sequentially and respectively controlled by a plurality of the periodic signal ports to sequentially and respectively receive a plurality of the data currents, and the second circuits are sequentially controlled by the enable port to sequentially and respectively duplicate the data currents from the first circuits and then sequentially and respectively send the data currents to the pixel group.

* * * * *